United States Patent
Wang et al.

(10) Patent No.: US 11,649,547 B2
(45) Date of Patent: May 16, 2023

(54) DEPOSITION OF CARBON DOPED SILICON OXIDE

(71) Applicant: Versum Materials US, LLC, Tempe, AZ (US)

(72) Inventors: Meiliang Wang, San Marcos, CA (US); Xinjian Lei, Vista, CA (US); Haripin Chandra, San Marcos, CA (US); Matthew R. MacDonald, Laguna Niguel, CA (US)

(73) Assignee: Versum Materials US, LLC, Tempe, AZ (US)

( * ) Notice: Subject to any disclaimer, the term of this patent is extended or adjusted under 35 U.S.C. 154(b) by 342 days.

(21) Appl. No.: 16/781,799

(22) Filed: Feb. 4, 2020

(65) Prior Publication Data

US 2020/0248309 A1    Aug. 6, 2020

Related U.S. Application Data

(60) Provisional application No. 62/801,248, filed on Feb. 5, 2019.

(51) Int. Cl.
| | | |
|---|---|---|
| *C23C 16/455* | (2006.01) | |
| *C23C 16/40* | (2006.01) | |
| *C07F 7/10* | (2006.01) | |
| *C07F 7/21* | (2006.01) | |

(52) U.S. Cl.
CPC .......... *C23C 16/45553* (2013.01); *C07F 7/10* (2013.01); *C07F 7/21* (2013.01); *C23C 16/401* (2013.01)

(58) Field of Classification Search
CPC .... C23C 16/45553; C23C 16/401; C07F 7/21
See application file for complete search history.

(56) References Cited

U.S. PATENT DOCUMENTS

| | | | |
|---|---|---|---|
| 2014/0287164 A1* | 9/2014 | Xiao | ..................... C23C 16/401 546/14 |
| 2015/0275355 A1* | 10/2015 | Mallikarjunan | ...... C23C 16/401 427/248.1 |
| 2018/0223047 A1* | 8/2018 | Xiao | ................. C23C 16/45527 |

* cited by examiner

*Primary Examiner* — Elizabeth A Burkhart
(74) *Attorney, Agent, or Firm* — David Benson

(57) ABSTRACT

A method for depositing a film comprising silicon and oxygen onto a substrate includes (a) providing a substrate in a reactor; (b) introducing into the reactor at least one silicon precursor compound selected from the group consisting of Formulae A, B, and C as described herein, (c) purging the reactor with a purge gas; (d) introducing at least one of an oxygen-containing source and a nitrogen-containing source into the reactor; and (e) purging the reactor with the purge gas, wherein the steps b through e are repeated until a desired thickness of resulting silicon-containing film is deposited; and (f) treating the resulting silicon-containing film with $R^3_x Si(NR^1 R^2)_{4-x}$ wherein $R^{1-3}$ are the same as aforementioned, preferably methyl or ethyl; and x=1, 2, or 3; and wherein the method is conducted at one or more temperatures ranging from about 20° C. to 300° C.

9 Claims, No Drawings

DEPOSITION OF CARBON DOPED SILICON OXIDE

CROSS-REFERENCE TO RELATED APPLICATIONS

This application claims priority to U.S. provisional application 62/801,248 filed on Feb. 5, 2019, the entire contents of which is incorporated herein by reference thereto for all allowable purposes.

FIELD OF THE INVENTION

The invention relates to organosilicon compounds which can be used to deposit silicon and oxygen containing films including carbon-doped silicon oxide films, methods for using the compounds for depositing silicon oxide containing films as well as films obtained from the compounds and methods.

BACKGROUND OF THE INVENTION

Atomic Layer Deposition (ALD) and Plasma Enhanced Atomic Layer Deposition (PEALD) are processes used to deposit, for example, silicon oxide conformal films at low temperature (<500° C.). In both ALD and PEALD processes, the precursor and reactive gas (such as oxygen or ozone) are separately pulsed in certain number of cycles to iteratively form a monolayer of silicon oxide at each cycle.

Organoaminosilane and chlorosilane precursors are known in the art and can be used to deposit silicon-containing films via Atomic Layer Deposition (ALD) and Plasma Enhanced Atomic Layer Deposition (PEALD) processes at a relatively low-temperature (<300° C.) and with relatively high growth per cycle (GPC>1.0 Å/cycle). There is a need in the art to provide a composition and a method using the same for depositing high carbon content (e.g., a carbon content of about 10 at. % or greater as measured by X-ray photoelectron spectroscopy (XPS)) silicon-containing films for certain applications within the electronics industry. Some important characteristics of a carbon-doped silicon-containing film are wet etch resistance and hydrophobicity. Generally speaking, the introduction of carbon to a silicon-containing film helps decrease the wet etch rate and increases the hydrophobicity. Additional advantages of adding carbon to a silicon containing film include lowering the dielectric constant and/or providing improvements to other electrical or physical attributes of the film.

Examples of known precursors and methods are disclosed in the following publications, patents, and patent applications.

U.S. Pub. No. 2015087139 AA describes the use of amino-functionalized carbosilanes to deposit silicon containing films via thermal ALD or PEALD processes.

U.S. Pat. No. 9,337,018 B2 describes the use of organoaminodisilanes to deposit silicon containing films via thermal ALD or PEALD processes.

U.S. Pat. Nos. 8,940,648 B2, 9,005,719 B2, and 8,912,353 B2 describe the use of organoaminosilanes to deposit silicon containing films via thermal ALD or PEALD processes.

U.S. Pub. No. 2015275355 AA describes the use of mono- and bis(organoamino)alkylsilanes to deposit silicon containing films via thermal ALD or PEALD processes.

U.S. Pub. No. 2015376211A describes the use of mono(organoamino)-, halido-, and pseudohalido-substituted trisilylamines to deposit silicon containing films via thermal ALD or PEALD processes.

Pub. No. WO15105350 describes the use of 4-membered ring cyclodisilazanes having at least one Si—H bond to deposit silicon containing films via thermal ALD or PEALD processes.

U.S. Pat. No. 8,575,033 describes methods for deposition of silicon carbide films on a substrate surface. The methods include the use of vapor phase carbosilane precursors and may employ plasma enhanced atomic layer deposition processes.

U.S. Publ. No. 2013/0224964 teaches a method of forming a dielectric film having Si—C bonds on a semiconductor substrate by atomic layer deposition (ALD), includes: (i) adsorbing a precursor on a surface of a substrate; (ii) reacting the adsorbed precursor and a reactant gas on the surface; and (iii) repeating steps (i) and (ii) to form a dielectric film having at least Si—C bonds on the substrate.

U.S. Publ. No. 2014/302688 describes a method for forming a dielectric layer on a patterned substrate that may include combining a silicon-and-carbon-containing precursor and a radical oxygen precursor in a plasma free substrate processing region within a chemical vapor deposition chamber. The silicon-and-carbon-containing precursor and the radical oxygen precursor react to deposit the flowable silicon-carbon-oxygen layer on the patterned substrate.

U.S. Publ. No. 2014/302690 describes methods for forming a low-k dielectric material on a substrate. The methods may include the steps of producing a radical precursor by flowing an unexcited precursor into a remote plasma region and reacting the radical precursor with a gas-phase silicon precursor to deposit a flowable film on the substrate. The gas-phase silicon precursor may include at least one silicon-and-oxygen containing compound and at least one silicon-and-carbon linker. The flowable film may be cured to form the low-k dielectric material.

U.S. Publ. No. 2014/051264 describes methods of depositing initially flowable dielectric films on substrates. The methods include introducing silicon-containing precursor to a deposition chamber that contains the substrate. The methods further include generating at least one excited precursor, such as radical nitrogen or oxygen precursor, with a remote plasma system located outside the deposition chamber. The excited precursor is also introduced to the deposition chamber, where it reacts with the silicon-containing precursor in a reaction zone deposits the initially flowable film on the substrate. The flowable film may be treated in, for example, a steam environment to form a silicon oxide film.

PCT Appl. No. WO14134476A1 describes methods for the deposition of films comprising SiCN and SiCON. Certain methods involve exposing a substrate surface to a first and second precursor, the first precursor having a formula $(X_yH_{3-y}Si)_zCH_{4-z}$, $(X_yH_{3-y}Si)(CH_2)(SiX_pH_{2-p})(CH_2)(SiX_yH_{3-y})$, or $(X_yH_{3-y}Si)(CH_2)_n(SiX_yH_{3-y})$, wherein X is a halogen, y has a value of between 1 and 3, d z has a value of between 1 and 3, p has a value of between 0 and 2, and n has a value between 2 and 5, and the second precursor includes a reducing amine. Certain methods also comprise exposure of the substrate surface to an oxygen source to provide a film comprising SiCON.

The reference entitled "Highly Stable Ultrathin Carbosiloxane Films by Molecular Layer Deposition", Han, Z. et al., Journal of Physical Chemistry C, 2013, 117, 19967 teaches growing a carbosiloxane film using 1,2-bis[(dimethylamino)dimethylsilyl]ethane and ozone. Thermal stability shows film is stable up to 40° C. with little thickness loss at 60° C.

There is a need for low k silicon-containing film such as, without limitation, silicon oxide, silicon oxynitride, silicon oxycarbonitride, or carbon doped silicon oxide via a thermal atomic layer deposition (ALD) or plasma enhanced atomic layer deposition (PEALD) process. The as deposited silicon-containing films such as, without limitation, silicon oxide, silicon oxynitride, silicon oxycarbonitride, or carbon doped silicon oxide via a thermal atomic layer deposition (ALD) or plasma enhanced atomic layer deposition (PEALD) process might have a high k value due to high moisture absorption or residual Si—OH groups contained in the film or low ash resistance due to low film density. Methods to lower the relative permittivity (k-value) of the silicon-containing films are also needed.

SUMMARY OF THE INVENTION

The present development solves problems associated with conventional precursors and processes by providing silicon- and carbon-containing precursors, which have at least an organoamino group that serves to anchor the precursor unit to the surface of a substrate as part of a process to deposit a silicon and oxygen containing film.

Described herein is a process for the deposition of a stoichiometric or nonstoichiometric silicon and oxygen containing material or film, such as without limitation, a silicon oxide, a carbon doped silicon oxide, a silicon oxynitride film, or a carbon doped silicon oxynitride film at relatively low temperatures, e.g., at one or more temperatures of 600° C. or lower, in a plasma enhanced ALD (PEALD), plasma enhanced cyclic chemical vapor deposition (PECCVD), a plasma enhanced ALD-like process, or an ALD process with oxygen-containing reactant source, a nitrogen-containing reactant source, or a combination thereof.

In one aspect, disclosed herein is a method for depositing a film comprising silicon and oxygen onto a substrate, the method comprising the steps of: (a) providing a substrate in a reactor; (b) introducing into the reactor at least one silicon precursor compound selected from the group consisting of Formulae A, B, and C

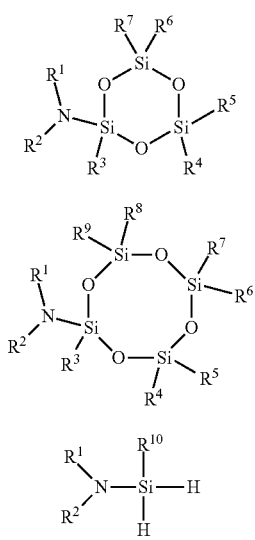

wherein $R^1$ is selected from a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_2$ to $C_{10}$ alkenyl group, a $C_2$ to $C_{10}$ alkynyl group, and a $C_4$ to $C_{10}$ aryl group, wherein $R^1$ and $R^2$ in Formula A, B or C are either linked to form a cyclic ring structure or are not linked to form a cyclic ring structure; $R^{3-9}$ are each independently selected from hydrogen, a linear $C_1$ to $C_{10}$ alkyl group, a branched $C_3$ to $C_{10}$ alkyl group, a $C_3$ to $C_{10}$ cyclic alkyl group, a $C_2$ to $C_{10}$ alkenyl group, a $C_2$ to $C_{10}$ alkynyl group, and a $C_4$ to $C_{10}$ aryl group; $R^{10}$ is selected from a linear $C_1$ to $C_{10}$ alkyl group, a $C_2$ to $C_{10}$ alkenyl group, and a $C_2$ to $C_{10}$ alkynyl group; (c) purging the reactor with a purge gas; (d) introducing at least one of an oxygen-containing source and a nitrogen-containing source into the reactor; and (e) purging the reactor with the purge gas, wherein the steps b through e are repeated until a desired thickness of resulting silicon-containing film is deposited; and (f) treating the resulting silicon-containing film with $R^3{}_xSi(NR^1R^2)_{4-x}$ wherein $R^{1-3}$ are the same as aforementioned, preferably methyl or ethyl; and x=1, 2, or 3; and wherein the method is conducted at one or more temperatures ranging from about 20° C. to 300° C.

Methods of making the above compounds are also disclosed herein.

Methods of treating the as-deposited films via chemical treatment or capping film deposition are further disclosed herein.

The embodiments of the invention can be used alone or in combinations with each other.

DETAILED DESCRIPTION OF THE INVENTION

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Described herein are compositions and methods related to the formation of a stoichiometric or nonstoichiometric film or material comprising silicon and oxygen such as, without limitation, a silicon oxide, a carbon doped silicon oxide film, a silicon oxynitride, or a carbon doped silicon oxynitride film or combinations thereof with one or more temperatures, of about 300° C. or less, or from about 25° C. to about 300° C. and, in some embodiments, from 25° C. to about 300° C. The films described herein are deposited in a deposition process such as an atomic layer deposition (ALD) or in an ALD-like process such as, without limitation, a plasma enhanced ALD (PEALD) or a plasma enhanced cyclic chemical vapor deposition process (PECCVD). The low temperature (e.g., one or more deposition temperatures ranging from about ambient temperature to 600° C.) deposition methods described herein provide films or materials that exhibit at least one or more of the following advantages: low chemical impurity, high conformality in a thermal atomic layer deposition, a plasma enhanced atomic layer deposition (ALD) process or a plasma enhanced ALD-like process, an ability to adjust carbon content in the resulting film; and/or films have an etching rate of 5 Angstroms per second (Å/sec) or less when measured in 0.5 wt % dilute HF. For carbon doped silicon oxide films, greater than 1% carbon is desired to tune the etch rate to values below 2 Å/sec in 0.5 wt % dilute HF in addition to other characteristics such as, without limitation, a density of about 1.4 g/cc or greater, about 1.8 g/cc or greater or about 2.0 g/cc or greater.

Methods disclosed herein can be practiced using equipment known in the art. For example, methods can employ a reactor that is conventional in the semiconductor manufacturing art.

Without wishing to be bound by any theory or explanation, it is believed that the effectiveness of the precursor compositions disclosed herein can vary as a function of the number of silicon atoms and, in particular, the silicon atom bonds. The precursors disclosed herein typically have between 3 and 5 silicon atoms, and between 5 and 8 silicon-oxygen bonds.

The precursors disclosed herein have different structures than known in this art and are able to perform better than conventional silicon-containing precursors and provide relatively high GPC, yielding a higher quality film, having a favorable wet etch rate, or having fewer elemental contaminations.

Disclosed here is a method for depositing a carbon doped silicon oxide film using a vapor deposition process, the composition comprising a compound having Formulae A, B, or C

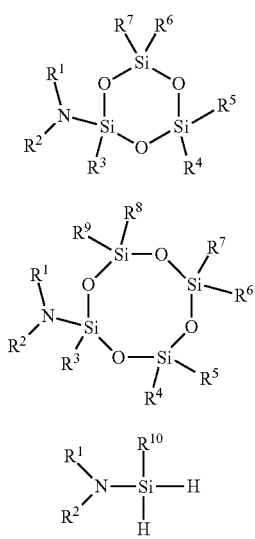

wherein $R^1$ is selected from a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_2$ to $C_{10}$ alkenyl group, a $C_2$ to $C_{10}$ alkynyl group, and a $C_4$ to $C_{10}$ aryl group, wherein $R^1$ and $R^2$ in Formula A or B are either linked to form a cyclic ring structure or are not linked to form a cyclic ring structure; $R^{3-9}$ are each independently selected from hydrogen, a linear $C_1$ to $C_{10}$ alkyl group, a branched $C_3$ to $C_{10}$ alkyl group, a $C_3$ to $C_{10}$ cyclic alkyl group, a $C_2$ to $C_{10}$ alkenyl group, a $C_2$ to $C_{10}$ alkynyl group, and a $C_4$ to $C_{10}$ aryl group; $R^{10}$ is selected from a linear $C_1$ to $C_{10}$ alkyl group, a $C_2$ to $C_{10}$ alkenyl group, and a $C_2$ to $C_{10}$ alkynyl group.

In a preferred embodiment, subject to the above provisos, for Formulae A and B, a preferred embodiment includes compounds wherein each of $R^{1-9}$ is a hydrogen or methyl and for Formula C, a preferred embodiment includes compounds wherein each of $R^{1-2}$ is a $C_3$ to $C_4$ alkyl and $R^{10}$ is methyl.

In the formulae above and throughout the description, the term "oligosiloxane" denotes a compound comprising at least three repeating —Si—O— siloxane units in a cyclic structure.

In the formulae above and throughout the description, the term "alkyl" denotes a linear or branched functional group having from 1 to 10 carbon atoms. Exemplary linear alkyl groups include, but are not limited to, methyl, ethyl, propyl, butyl, pentyl, and hexyl groups. Exemplary branched alkyl groups include, but are not limited to, iso-propyl, iso-butyl, sec-butyl, tert-butyl, iso-pentyl, tert-pentyl, iso-hexyl, and neo-hexyl. In certain embodiments, the alkyl group may have one or more functional groups attached thereto such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

In the formulae above and throughout the description, the term "cyclic alkyl" denotes a cyclic functional group having from 3 to 10 carbon atoms. Exemplary cyclic alkyl groups include, but are not limited to, cyclobutyl, cyclopentyl, cyclohexyl, and cyclooctyl groups.

In the formulae above and throughout the description, the term "alkenyl group" denotes a group which has one or more carbon-carbon double bonds and has from 2 to 10 or from 2 to 6 carbon atoms.

In the formulae described herein and throughout the description, the term "dialkylamino" group, "alkylamino" group, or "organoamino" group denotes a group which has two alkyl groups bonded to a nitrogen atom or one alkyl bonded to a nitrogen atom and has from 1 to 10 or from 2 to 6 or from 2 to 4 carbon atoms. Examples include but are not limited to HNMe, HNBu$^t$, NMe$_2$, NMeEt, NEt$_2$, and NPr$^i_2$.

In the formulae above and throughout the description, the term "aryl" denotes an aromatic cyclic functional group having from 4 to 10 carbon atoms, from 5 to 10 carbon atoms, or from 6 to 10 carbon atoms. Exemplary aryl groups include, but are not limited to, phenyl, benzyl, chlorobenzyl, tolyl, o-xylyl, 1,2,3-triazolyl, pyrrrolyl, and furanyl.

Throughout the description, the term "alkyl hydrocarbon" refers a linear or branched C, to C$_{20}$ hydrocarbon, cyclic C$_6$ to C$_{20}$ hydrocarbon. Exemplary hydrocarbons include, but not limited to, heptane, octane, nonane, decane, dodecane, cyclooctane, cyclononane, and cyclodecane.

Throughout the description, the term "alkoxy" refers a C$_1$ to C$_{10}$—OR$^1$ group, wherein R$^1$ is defined as above. Exemplary alkoxy groups include, but are not limited to, methoxy, ethoxy, iso-propoxy, n-propoxy, n-butoxy, sec-butoxy, tert-butoxy, and phenoxide.

Throughout the description, the term "ashing" refers to a process to remove the photoresist or carbon hard mask in semiconductor manufacturing process using a plasma comprising oxygen source such as $O_2$/inert gas plasma, $O_2$ plasma, $CO_2$ plasma, CO plasma, $H_2/O_2$ plasma or combination thereof In the formulae above and throughout the description, the term "heterocyclic" means a non-aromatic saturated monocyclic or multicyclic ring system of about 3 to about 10 ring atoms, preferably about 5 to about 10 ring atoms, in which one or more of the atoms in the ring system is/are element(s) other than carbon, for example nitrogen, oxygen or sulfur. Preferred heterocycles contain about 5 to about 6 ring atoms. The prefix aza, oxo or thio before heterocycle means that at least a nitrogen, oxygen or sulfur atom respectively is present as a ring atom. The heterocyclic group is optionally substituted.

Exemplary silicon compounds having Formulae A-C are listed in Table 1a and 1b:

TABLE 1a

Exemplary silicon compounds having Formulae A or B:

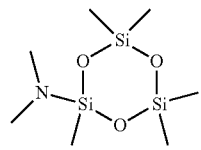

2-dimethylamino-
2,4,4,6,6-pentamethyl-
cyclotrisiloxane

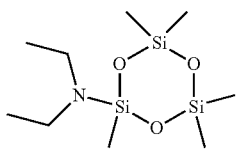

2-dimethylamino-2,4,4,
6,6-pentamethylcyclo-
trisiloxane

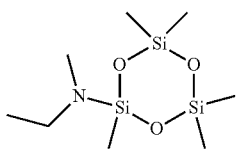

2-ethylmethylamino-
2,4,4,6,6-pentamethyl-
cyclotrisiloxane

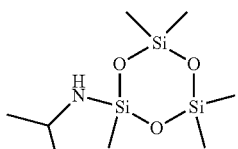

2-iso-propylamino-
2,4,4,6,6-pentamethyl-
cyclotrisiloxane

TABLE 1a-continued

Exemplary silicon compounds having Formulae A or B:

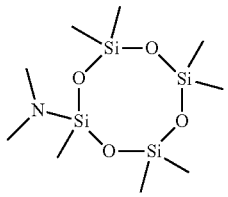

2-dimethylamino-2,4,4,
6,6,8,8-heptamethylcyclo-
tetrasiloxane

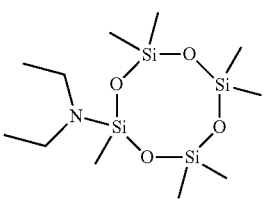

2-diethylamino-2,4,4,
6,6,8,8-heptamethyl-
cyclotetrasiloxane

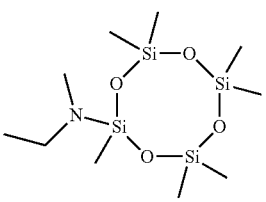

2-ethylmethylamino-
2,4,4,6,6,8,8-heptamethyl-
cyclotetrasiloxane

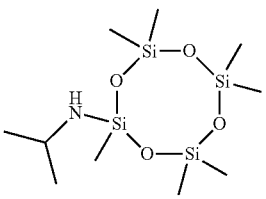

2-iso-propylamino-2,4,4,
6,6,8,8-heptamethylcyclo-
tetrasiloxane

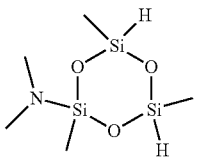

2-dimethylamino-
2,4,6-trimethylcyclo-
trisiloxane

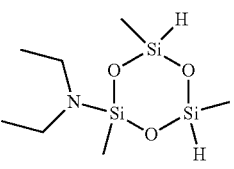

2-diethylamino-2,4,6-
trimethylcyclotrisiloxane

TABLE 1a-continued

Exemplary silicon compounds having Formulae A or B:

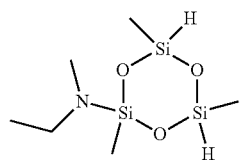

2-ethylmethylamino-2,4,6-
trimethylcyclotrisiloxane

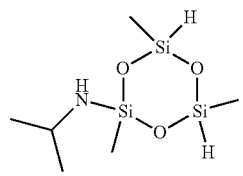

2-iso-propylamino-2,4,6-
trimethylcyclotrisiloxane

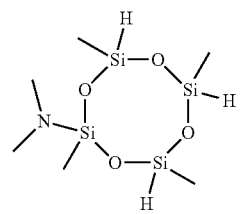

2-dimethylamino-2,4,6,8-
tetramethylcyclotetrasiloxane

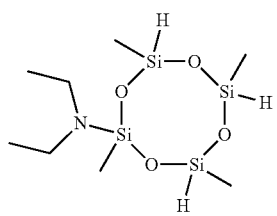

2-diethylamino-2,4,6,8-
tetramethylcyclotetrasiloxane

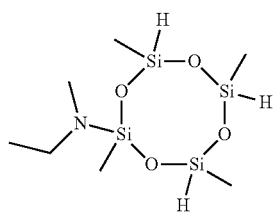

2-ethylmethylamino-2,4,6,8-
tetramethylcyclotetrasiloxane

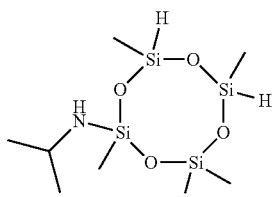

2-iso-propylamino-2,4,6,8-
tetramethylcyclotetrasiloxane

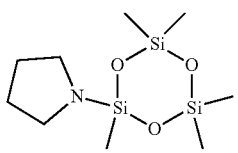

2-pyrrolidino-2,4,4,6,6-
pentamethylcyclotrisiloxane

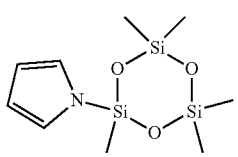

2-pyrrolyl-2,4,4,6,6-penta-
methylcyclotrisiloxane

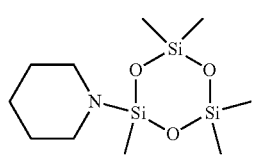

2-piperidino-2,4,4,6,6-
pentamethylcyclo-
trisiloxane

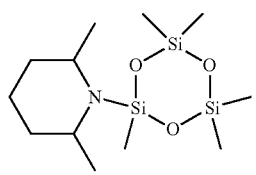

2-2,5-dimethylpiperidino-
2,4,4,6,6-pentamethyl-
cyclotrisiloxane

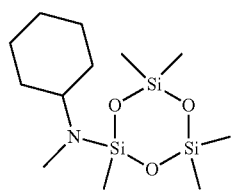

2-cyclohexylmethylamino-
2,4,4,6,6-pentamethyl-
cyclotrisiloxane

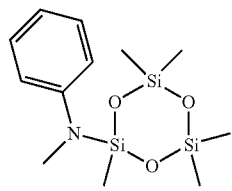

2-phenylmethylamino-
2,4,4,6,6-pentamethyl-
cyclotrisiloxane

TABLE 1a-continued

Exemplary silicon compounds having Formulae A or B:

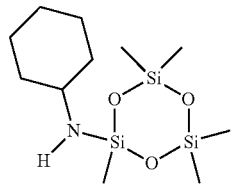

2-cyclohexylamino-
2,4,4,6,6-pentamethyl-
cyclotrisiloxane

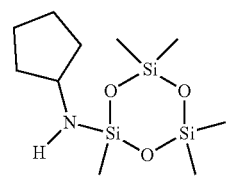

2-cyclopentylamino-2,4,4,
6,6-pentamethylcyclo-
trisiloxane

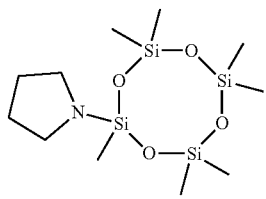

2-pyrrolidino-2,4,4,6,6,8,8-
heptamethylcyclotetrasiloxane

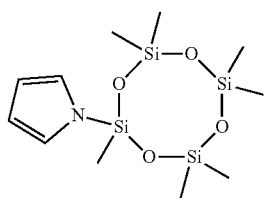

2-pyrrolyl-2,4,4,6,6,8,8-
heptamethylcyclotetra-
siloxane

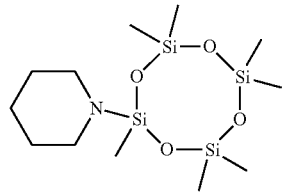

2-piperidino-2,4,4,6,6,8,8-
heptamethylcyclotetrasiloxane

TABLE 1a-continued

Exemplary silicon compounds having Formulae A or B:

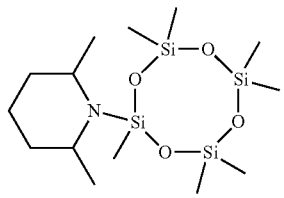

2-2,5-dimethylpiperidino-
2,4,4,6,6,8,8-heptamethyl-
cyclotetrasiloxane

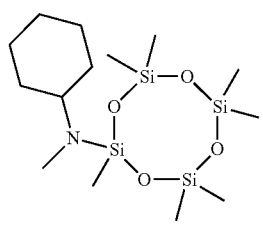

2-cyclohexylmethylamino-
2,4,4,6,6,8,8-heptamethyl-
cyclotetrasiloxane

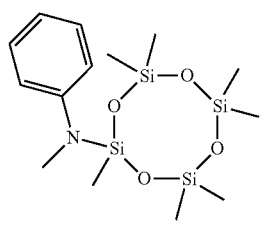

2-phenylmethylamino-2,4,4,
6,6,8,8-heptamethylcyclo-
tetrasiloxane

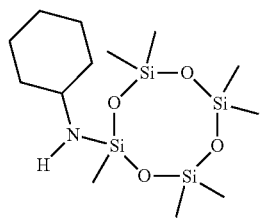

2-cyclohexylamino-2,4,4,
6,6,8,8-heptamethyl-
cyclotetrasiloxane

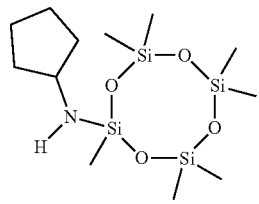

2-cyclopentylamino-2,4,4,
6,6,8,8-heptamethylcyclo-
tetrasiloxane

TABLE 1a-continued

Exemplary silicon compounds having Formulae A or B:

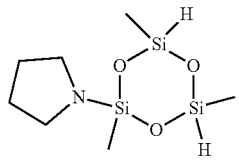

2-pyrrolidine-2,4,6-
trimethylcyclotrisiloxane

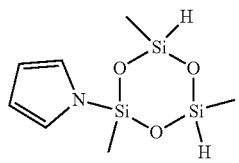

2-pyrrolyl-2,4,6-
trimethylcyclotrisiloxane

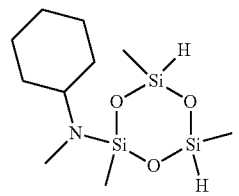

2-cyclohexylmethylamino-
2,4,6-trimethylcyclo-
trisiloxane

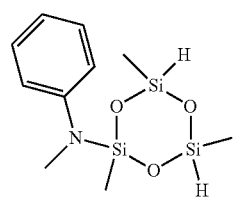

2-phenylmethylamino-
2,4,6-trimethylcyclo-
trisiloxane

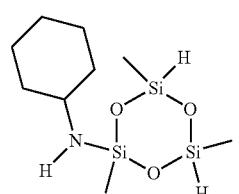

2-cyclohexylamino-2,4,6-
trimethylcyclotrisiloxane

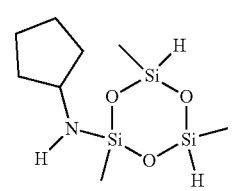

2-cyclopentylamino-
2,4,6-trimethylcyclo-
trisiloxane

TABLE 1a-continued

Exemplary silicon compounds having Formulae A or B:

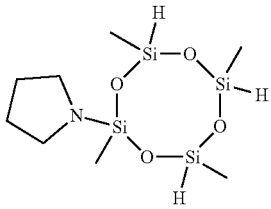

2-pyrrolidino-2,4,6,8-
tetramethylcyclotetra-
siloxane

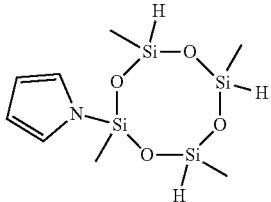

2-pyrrolyl-2,4,6,8-tetramethyl-
cyclotetrasiloxane

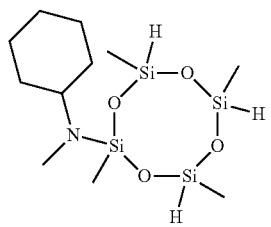

2-cyclohexylmethylamino-
2,4,6,8-tetramethylcyclo-
tetrasiloxane

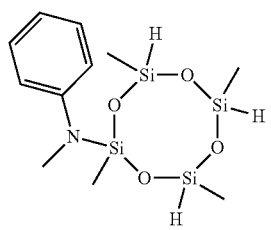

2-phenylmethylamino-2,4,6,8-
tetramethylcyclotetrasiloxane

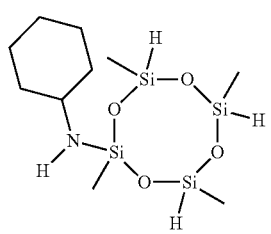

2-cyclohexylamino-2,4,6,8-
tetramethylcyclotetrasiloxane

TABLE 1a-continued

Exemplary silicon compounds having Formulae A or B:

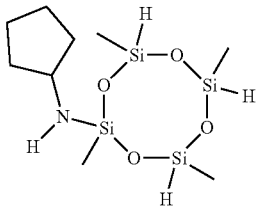

2-cyclopentylamino-2,4,6,8-
tetramethylcyclotetrasiloxane

TABLE 1b

Exemplary silicon compounds having Formula C:

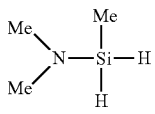

dimethylamino-
methylsilane

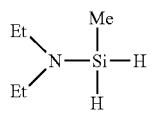

diethylamino-
methylsilane

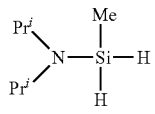

di-iso-propyl-
aminomethyl-
silane

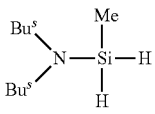

di-sec-butylamino-
methylsilane

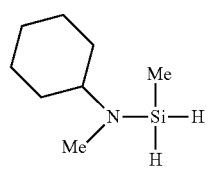

cyclohexylmethyl-
aminomethylsilane

TABLE 1b-continued

Exemplary silicon compounds having Formula C:

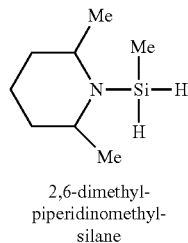

2,6-dimethyl-
piperidinomethyl-
silane

The silicon precursor compounds having Formulae A, B, or C according to the present invention and compositions comprising the silicon precursor compounds having Formulae A or B according to the present invention are preferably substantially free of halide ions. As used herein, the term "substantially free" as it relates to halide ions (or halides) such as, for example, chlorides (i.e. chloride-containing species such as HCl or silicon compounds having at least one Si—Cl bond) and fluorides, bromides, and iodides, means less than 5 ppm (by weight) measured by ICP-MS, preferably less than 3 ppm measured by ICP-MS, and more preferably less than 1 ppm measured by ICP-MS, and most preferably 0 ppm measured by ICP-MS. Chlorides are known to act as decomposition catalysts for the silicon precursor compounds having Formulae A to C. Significant levels of chloride in the final product can cause the silicon precursor compounds to degrade. The gradual degradation of the silicon precursor compounds may directly impact the film deposition process making it difficult for the semiconductor manufacturer to meet film specifications. In addition, the shelf-life or stability is negatively impacted by the higher degradation rate of the silicon precursor compounds thereby making it difficult to guarantee a 1-2 year shelf-life. Therefore, the accelerated decomposition of the silicon precursor compounds presents safety and performance concerns related to the formation of these flammable and/or pyrophoric gaseous byproducts. The silicon precursor compounds having Formulae A or B are preferably substantially free of metal ions such as, $Li^+$, $Mg^{2+}$, $Al^{3+}$, $Fe^{2+}$, $Fe^{2+}$, $Fe^{3+}$, $Ni^{2+}$, $Cr^{3+}$. As used herein, the term "substantially free" as it relates to Li, Al, Fe, Ni, Cr means less than 5 ppm (by weight), preferably less than 3 ppm, and more preferably less than 1 ppm, and most preferably 0.1 ppm as measured by ICP-MS. In some embodiments, the silicon precursor compounds having Formula A are free of metal ions such as, $Li^+$, $Mg^{2+}$, $Al^{3+}$, $Fe^{2+}$, $Fe^{3+}$, $Ni^{2+}$, $Cr^{3+}$. As used herein, the term "free of" metal impurities as it relates to Li, Mg, Al, Fe, Ni, Cr, noble metal such as volatile Ru or Pt complexes from ruthenium or platinum catalysts used in the synthesis, means less than 1 ppm, preferably 0.1 ppm (by weight) as measured by ICP-MS or other analytical method for measuring metals.

In one embodiment of the present invention, a method is described herein for depositing a carbon doped silicon and oxygen containing film on at least one surface of a substrate at temperatures from 20° C. to 300° C., wherein the method comprises the steps of:
  a. providing a substrate in a reactor;
  b. introducing into the reactor at least one silicon precursor having the Formulae A to C described herein;
  c. purging the reactor with purge gas to remove at least a portion of the unabsorbed precursors;

d. introducing an oxygen-containing source into the reactor;
e. purging the reactor with purge gas to remove at least a portion of the unreacted oxygen-containing source;
f. repeating steps b through e until a desired thickness of the silicon-containing film is deposited; and
g. Treating the resulting silicon-containing film with a silicon precursor having a formula of $R^3_x Si(NR^1R^2)_{4-x}$ wherein $R^{1-3}$ are each independently selected from hydrogen, a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, preferably methyl or ethyl, and x=1, 2, or 3.
h. purging the reactor with purge gas to remove at least a portion of any by-products from a reaction between surface hydroxyls on the silicon-containing film with the silicon precursor having a formula of $R^3_x Si(NR^1R^2)_{4-x}$.

In particular embodiments, during the deposition process, as-deposited films via steps b to f are treated using steps g to h, and steps g to h are performed, for example, via one (1) ALD cycles, two (2) ALD cycles, five (5) ALD cycles, or ten (10) or more ALD cycles until all reactive hydroxyls are consumed, allowing the dielectric constant to be reduced to 5 or less, preferably 4 or less, most preferably 3 or less. Exemplary silicon precursors having a formula of $R^3_x Si(NR^1R^2)_{4-x}$ include, but are not limited to, diethylaminotriethylsilane, dimethylaminotriethylsilane, ethylmethylaminotriethylsilane, t-butylaminotriethylsilane, isopropylaminotriethylsilane, di-isopropylaminotriethylsilane, pyrrolidonotriethylsilane, diethylaminotrimethylsilane, dimethylaminotrimethylsilane, ethylmethylaminotrimethylsilane, t-butylaminotrimethylsilane, iso-propylaminotrimethylsilane, di-isopropylaminotrimethylsilane, pyrrolidonotrimethylsilane, diethylaminodimethylsilane, dimethylaminodimethylsilane, ethylmethylaminodimethylsilane, t-butylaminodimethylsilane, iso-propylaminodimethylsilane, di-isopropylaminodimethylsilane, pyrrolidinodimethylsilane, diethylaminodiethylsilane, dimethylaminodiethylsilane, ethylmethylaminodiethylsilane, t-butylaminodiethylsilane, isopropylaminodiethylsilane, di-isopropylaminodiethylsilane, pyrrolidinodiethylsilane, bis(diethylamino)dimethylsilane, bis(dimethylamino)dimethylsilane, bis(ethylmethylamino)dimethylsilane, bis(di-isopropyllamino)dimethylsilane, bis(iso-propylamino)dimethylsilane, bis(tert-butylamino)dimethylsilane, dipyrrolidinodimethylsilane, bis(diethylamino)diethylsilane, bis(dimethylamino)diethylsilane, bis(ethylmethylamino)diethylsilane, bis(di-isopropyllamino)diethylsilane, bis(iso-propylamino)diethylsilane, bis(tert-butylamino)diethylsilane, dipyrrolidinodiethylsilane, bis(diethylamino)methylvinylsilane, bis(dimethylamino)methylvinylsilane bis(ethylmethylamino)methylvinylsilane, bis(di-isopropyllamino)methylvinylsilane, bis(iso-propylamino)methylvinylsilane, bis(tert-butylamino)methylvinylsilane, dipyrrolidino methylvinylsilane, 2,6-dimethylpiperidinomethylsilane, 2,6-dimethylpiperidinodimethylsilane, 2,6-dimethylpiperidinotrimethylsilane, tris(dimethylamino) phenylsilane, tris(dimethylamino)methylsilane, tris (dimethylamino)ethylsilane, and mixtures thereof. In some embodiments, steps g to h can be conducted in the temperatures ranging from 300° C. to 550° C. after steps b to f are performed for a desired thickness.

In another particular embodiment, the method described herein deposits a silicon and oxygen containing film comprising two silicon-containing films on a substrate at temperatures from 20° C. to 300° C. The method comprises the following steps:
a. providing a substrate in a reactor;
b. introducing into the reactor at least one silicon precursor having the Formulae A to C described herein;
c. purging the reactor with purge gas to remove at least a portion of the unabsorbed precursors;
d. introducing an oxygen-containing source into the reactor;
e. purging the reactor with purge gas to remove at least a portion of the unreacted oxygen-containing source;
f. repeating steps b through e until a desired thickness of a primary silicon-containing film is deposited;
g. introducing into the reactor at least one silicon precursor having the Formula $R^3_x Si(NR^1R^2)_{4-x}$ wherein $R^{1-3}$ are each independently selected from hydrogen, a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, and a $C_3$ to $C_{10}$ alkynyl group, preferably methyl or ethyl; and x=1, 2, 3;
h. purging the reactor with purge gas to remove at least a portion of the unabsorbed precursors;
i. introducing an oxygen-containing source into the reactor;
j. purging the reactor with purge gas to remove at least a portion of the unreacted oxygen-containing source; and
k. repeating steps g through j until a desired thickness of a secondary silicon-containing film is deposited;

In one particular embodiment, during the deposition process, the desired thickness of the primary silicon-containing film via steps b to f is in the range of 10 Å to 500 Å, or 10 Å to 100 Å, or 10 Å to 50 Å. The desired thickness of the secondary silicon-containing film via steps g to k is in range of 1 Å to 50 Å, or 2 Å to 40 Å, or 2 Å to 30 Å, or 2 Å to 20 Å, or 2 Å to 10 Å. The secondary silicon-containing film has a higher density and less carbon content than the primary silicon-containing film, thus providing oxygen ashing resistance during semiconductor fabrication processes and resulting in less damage to the primary silicon-containing film. Exemplary silicon precursors in this embodiment having a formula of $R^3_x Si(NR^1R^2)_{4-x}$ wherein $R^3$ is hydrogen, $R^{2-3}$ are each independently selected from hydrogen, a linear $C_1$ to $C_5$ alkyl group, a branched $C_3$ to $C_5$ alkyl group, and x=1, 2 include, but are not limited to, di-iso-propylaminosilane, di-sec-butylaminosilane, bis(diethylamino)silane, bis(tert-butylamino)silane, and mixtures thereof. In some embodiments, steps b to f are conducted at lower temperatures from 20° C. to 150° C. to maximize carbon content reserved in the carbon doped silicon oxide while steps g to k are performed higher temperatures from 200° C. to 300° C. to provide denser silicon oxide with less carbon content, allowing the secondary silicon-containing film to be better ash resistant. In certain embodiments, the oxygen-containing source in steps d and i are same. In an alternative embodiment, the oxygen-containing source in steps d and i are different. In some embodiments, steps g to h can be conducted in the temperatures ranging from 300° C. to 550° C. after steps b to f are performed for a desired thickness.

The methods disclosed herein form a carbon doped silicon oxide film comprising at least one of the following characteristics: a density of at least about 1.4 g/cc or higher, about 1.8 g/cc or higher, or about 2.1 g/cc or higher; a wet etch rate that is less than about 2.5 Å/s as measured in a solution of 1:100 of HF to water dilute HF (0.5 wt. % dHF) acid; and a hydrogen impurity of less than about 5 e20 at/cc as measured by Secondary Ion Mass Spectrometry (SIMS).

In certain embodiments of the method and composition described herein, a layer of silicon-containing dielectric material, for example, is deposited on at a least a portion of a substrate via a chemical vapor deposition (CVD) process employing a reaction chamber. Suitable substrates include, but are not limited to, semiconductor materials such as gallium arsenide ("GaAs"), silicon, and compositions containing silicon such as crystalline silicon, polysilicon, amorphous silicon, epitaxial silicon, silicon dioxide ("$SiO_2$"), silicon glass, silicon nitride, fused silica, glass, quartz, borosilicate glass, and combinations thereof. Other suitable materials include chromium, molybdenum, and other metals commonly employed in semiconductor, integrated circuits, flat panel display, and flexible display applications. The substrate may have additional layers such as, for example, silicon, $SiO_2$, organosilicate glass (OSG), fluorinated silicate glass (FSG), boron carbonitride, silicon carbide, hydrogenated silicon carbide, silicon nitride, hydrogenated silicon nitride, silicon carbonitride, hydrogenated silicon carbonitride, boronitride, organic-inorganic composite materials, photoresists, organic polymers, porous organic and inorganic materials and composites, metal oxides such as aluminum oxide, and germanium oxide. Still further layers can also be germanosilicates, aluminosilicates, copper and aluminum, and diffusion barrier materials such as, but not limited to, TiN, Ti(C)N, TaN, Ta(C)N, Ta, W, or WN.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon, hydrogen ($H_2$), and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

A purge gas such as argon purges away unabsorbed excess complex from the process chamber. After sufficient purging, an oxygen source may be introduced into reaction chamber to react with the absorbed surface followed by another gas purge to remove reaction by-products from the chamber. The process cycle can be repeated to achieve the desired film thickness. In some cases, pumping can replace a purge with inert gas or both can be employed to remove unreacted silicon precursors.

Throughout the description, the term "ALD or ALD-like" refers to a process including, but not limited to, the following processes: a) each reactant including a silicon precursor and a reactive gas is introduced sequentially into a reactor such as a single wafer ALD reactor, semi-batch ALD reactor, or batch furnace ALD reactor; b) each reactant including the silicon precursor and the reactive gas is exposed to a substrate by moving or rotating the substrate to different sections of the reactor and each section is separated by inert gas curtain, i.e., spatial ALD reactor or roll to roll ALD reactor.

The method of the present invention is conducted via an ALD process that uses an oxygen-containing source such as ozone, hydrogen peroxide or an oxygen-containing source which comprises a plasma wherein the plasma can further comprise an inert gas such as one or more of the following: an oxygen plasma with or without inert gas, a water vapor plasma with or without inert gas, a nitrogen oxide (e.g., $N_2O$, NO, $NO_2$, or combination thereof) plasma with or without inert gas, a carbon oxide (e.g., $CO_2$, CO, or combination thereof) plasma with or without inert gas, and combinations thereof. In certain embodiments, the oxygen-containing plasma source further comprises an inert gas. In these embodiments, the inert gas is selected from the group consisting of argon, helium, nitrogen, hydrogen, or combinations thereof. In an alternative embodiment, the oxygen-containing plasma source does not comprise an inert gas.

The oxygen-containing plasma source can be generated in situ or, alternatively, remotely. In one particular embodiment, the oxygen-containing source comprises oxygen and is flowing, or introduced during method steps b through d, along with other reagents such as without limitation, the at least one silicon precursor and optionally an inert gas.

In certain embodiments, the compositions described herein—and which are employed in the disclosed methods—further comprises a solvent. Exemplary solvents can include, without limitation, ether, tertiary amine, alkyl hydrocarbon, aromatic hydrocarbon, tertiary aminoether, and combinations thereof. In certain embodiments, the difference between the boiling point of the silicon precursor and the boiling point of the solvent is 40° C. or less. In some embodiments, the compositions can be delivered via direct liquid injection into a reactor chamber for silicon-containing film.

For those embodiments wherein at least one silicon precursor(s) having Formulae A to C is (are) used in a composition comprising a solvent, the solvent or mixture thereof selected does not react with the silicon precursor. The amount of solvent by weight percentage in the composition ranges from 0.5 wt % by weight to 99.5 wt % or from 10 wt % by weight to 75 wt %. In this or other embodiments, the solvent has a boiling point (b.p) similar to the b.p. of the silicon precursor of Formula A to C or the difference between the b.p. of the solvent and the b.p. of the silicon precursor of Formula A to C is 40° C. or less, 30° C. or less, or 20° C. or less, or 10° C. Alternatively, the difference between the boiling points ranges from any one or more of the following end-points: 0, 10, 20, 30, or 40° C. Examples of suitable ranges of b.p. difference include without limitation, 0 to 40° C., 20° to 30° C., or 10° to 30° C. Examples of suitable solvents in the compositions include, but are not limited to, an ether (such as 1,4-dioxane, dibutyl ether), a tertiary amine (such as pyridine, 1-methylpiperidine, 1-ethylpiperidine, N,N'-Dimethylpiperazine, N,N,N',N'-Tetramethylethylenediamine), a nitrile (such as benzonitrile), an alkyl hydrocarbon (such as octane, nonane, dodecane, ethylcyclohexane), an aromatic hydrocarbon (such as toluene, mesitylene), a tertiary aminoether (such as bis(2-dimethylaminoethyl) ether), or mixtures thereof.

In certain embodiments, silicon oxide or carbon doped silicon oxide films deposited using the methods described herein are formed in the presence of oxygen-containing source comprising ozone, water ($H_2O$) (e.g., deionized water, purifier water, and/or distilled water), oxygen ($O_2$), oxygen plasma, NO, $N_2O$, $NO_2$, carbon monoxide (CO), carbon dioxide ($CO_2$) and combinations thereof. The oxygen-containing source is passed through, for example, either an in situ or remote plasma generator to provide oxygen-containing plasma source comprising oxygen such as an oxygen plasma, a plasma comprising oxygen and argon, a plasma comprising oxygen and helium, an ozone plasma, a water plasma, a nitrous oxide plasma, or a carbon dioxide plasma. In certain embodiments, the oxygen-containing plasma source comprises an oxygen source gas that is introduced into the reactor at a flow rate ranging from about 1 to about 2000 standard cubic centimeters (sccm) or from about 1 to about 1000 sccm. The oxygen-containing plasma source can be introduced for a time that ranges from about 0.1 to about 100 seconds. In one particular embodiment, the oxygen-containing plasma source comprises water having a temperature of 10° C. or greater. In embodiments wherein the film is deposited by a PEALD or a plasma enhanced cyclic CVD process, the precursor pulse can have a pulse duration that is greater than 0.01 seconds (e.g., about 0.01 to about 0.1 seconds, about 0.1 to about 0.5 seconds, about 0.5 to about 10 seconds, about 0.5 to about 20 seconds, about 1 to about 100 seconds) depending on the ALD reactor's volume, and the oxygen-containing plasma source can have a pulse duration that is less than 0.01 seconds (e.g., about 0.001 to about 0.01 seconds).

The respective step of supplying the precursors, oxygen source, and/or other precursors, source gases, and/or reagents may be performed by changing the time for supplying them to change the stoichiometric composition of the resulting dielectric film.

Energy is applied to the at least one of the silicon precursors of Formulae A to C, oxygen containing source, or combination thereof to induce reaction and to form the dielectric film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively, a remote plasma-generated process in which plasma is generated outside of the reactor and supplied into the reactor.

The at least one silicon precursor may be delivered to the reaction chamber such as a plasma enhanced cyclic CVD or PEALD reactor or a batch furnace type reactor in a variety of ways. In one embodiment, a liquid delivery system is utilized. In an alternative embodiment, a combined liquid delivery and flash vaporization process unit are employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

As previously mentioned, the purity level of the at least one silicon precursor is sufficiently high enough to be acceptable for reliable semiconductor manufacturing. In certain embodiments, the at least one silicon precursor described herein comprise less than 2% by weight, or less than 1% by weight, or less than 0.5% by weight of one or more of the following impurities: free amines, free halides or halogen ions, and higher molecular weight species. Higher purity levels of the silicon precursor described herein can be obtained through one or more of the following processes: purification, adsorption, and/or distillation.

In one embodiment of the method described herein, a plasma enhanced cyclic deposition process such as PEALD-like or PEALD may be used wherein the deposition is conducted using the at least one silicon precursor and an oxygen plasma source. The PEALD-like process is defined as a plasma enhanced cyclic CVD process but still provides high conformal silicon and oxygen-containing films.

It is believed that organoamino-functionalized cyclic oligosiloxane precursors having Formulae A to B, wherein some of $R^{3-9}$ are not hydrogen but methyl, are preferred for this method because they either do not comprise any Si—H groups, or the number of Si—H groups are limited, since Si—H groups can decompose at temperatures higher than 600° C. and can potentially cause undesired chemical vapor deposition. However, it is possible that under certain conditions, such as using short precursor pulses or low reactor pressures, this method can also be carried out using organoamino-functionalized cyclic oligosiloxane precursors having Formulae A to B, wherein any of $R^{3-9}$ are hydrogen, at temperatures above 600° C. without significant undesirable chemical vapor deposition.

Various commercial ALD reactors such as single wafer, semi-batch, batch furnace or roll to roll reactor can be employed for depositing the solid silicon oxide, silicon oxynitride, carbon doped silicon oxynitride, or carbon doped silicon oxide.

Process temperature for the method described herein use one or more of the following temperatures as endpoints: 0° C., 25° C., 50° C., 75° C., 100° C., 125° C., 150° C., 175° C., 200° C., 225° C., 250° C., 275° C., 300° C. Exemplary temperature ranges include, but are not limited to the following: from about 0° C. to about 300° C.; or from about 25° C. to about 300° C.; or from about 50° C. to about 290° C.; or from about 25° C. to about 250° C., or from about 25° C. to about 200° C.

In certain embodiments, the oxygen source is selected from the group consisting of water vapors, water plasma, ozone, oxygen, oxygen plasma, oxygen/helium plasma, oxygen/argon plasma, nitrogen oxides plasma, carbon dioxide plasma, hydrogen peroxide, organic peroxides, and mixtures thereof In a still further embodiment of the method described herein, the film or the as-deposited film deposited from ALD, ALD-like, PEALD, or PEALD-like is subjected to a treatment step (post deposition treatment). The treatment step can be conducted during at least a portion of the deposition step, after the deposition step, and combinations thereof. Exemplary treatment steps include, without limitation, treatment via high temperature thermal annealing at temperatures ranging from 500° C. to 1200° C., or from 600° C. to 800° C., or from 550° C. to 750° C., or from 600° C. to 750° C., or from 600° C. to 700° C.; plasma treatment such as helium plasma, argon plasma; ultraviolet (UV) light treatment; laser; electron beam treatment and combinations thereof to affect one or more properties of the film.

In another embodiment, a vessel or container for depositing a silicon-containing film comprising one or more silicon precursor compounds described herein. In one particular embodiment, the vessel comprises at least one pressurizable vessel (preferably of stainless steel having a design such as disclosed in U.S. Pat. Nos. 7,334,595; 6,077,356; 5,069,244; and 5,465,766 the disclosure of which is hereby incorporated by reference. The container can comprise either glass (borosilicate or quartz glass) or type 316, 316L, 304 or 304L stainless steel alloys (UNS designation S31600, S31603, S30400 S30403) fitted with the proper valves and fittings to allow the delivery of one or more precursors to the reactor for a CVD or an ALD process. In this or other embodiments, the silicon precursor is provided in a pressurizable vessel comprised of stainless steel and the purity of the precursor is 98% by weight or greater or 99.5% or greater which is suitable for the majority of semiconductor applications. The head-space of the vessel or container is filled with inert gases selected from helium, argon, nitrogen and combination thereof.

In certain embodiments, the gas lines connecting from the precursor canisters to the reaction chamber are heated to one or more temperatures depending upon the process requirements and the container of the at least one silicon precursor is kept at one or more temperatures for bubbling. In other embodiments, a solution comprising the at least one silicon precursor is injected into a vaporizer kept at one or more temperatures for direct liquid injection.

A flow of argon and/or other gas may be employed as a carrier gas to help deliver the vapor of the at least one silicon precursor to the reaction chamber during the precursor pulsing. In certain embodiments, the reaction chamber process pressure is about 50 mTorr to 10 Torr. In other embodiments, the reaction chamber process pressure can be up to 760 Torr (e.g., about 50 mtorr to about 100 Torr).

In a typical PEALD or a PEALD-like process such as a PECCVD process, the substrate such as a silicon oxide substrate is heated on a heater stage in a reaction chamber that is exposed to the silicon precursor initially to allow the complex to chemically adsorb onto the surface of the substrate.

The films deposited with the silicon precursors having Formulae A to C described herein, when compared to films deposited with previously disclosed silicon precursors under the same conditions, have improved properties such as, without limitation, a wet etch rate that is lower than the wet etch rate of the film before the treatment step or a density that is higher than the density prior to the treatment step. In one particular embodiment, during the deposition process, as-deposited films are intermittently treated. These intermittent or mid-deposition treatments can be performed, for example, after each ALD cycle, after every a certain number of ALD cycles, such as, without limitation, one (1) ALD cycle, two (2) ALD cycles, five (5) ALD cycles, or after every ten (10) or more ALD cycles.

The precursors of Formulae A to C exhibit a growth rate of 1.0 Å/cycle or greater, preferable 1.5 Å/cycle or greater, most preferably 2.0 Å/cycle or greater.

In an embodiment wherein the film is treated with a high temperature annealing step, the annealing temperature is at least 100° C. or greater than the deposition temperature. In this or other embodiments, the annealing temperature ranges from about 400° C. to about 1000° C. In this or other embodiments, the annealing treatment can be conducted in a vacuum (<760 Torr), inert environment or in oxygen containing environment (such as $H_2O$, $N_2O$, $NO_2$ or $O_2$).

In an embodiment wherein the film is treated to UV treatment, film is exposed to broad band UV or, alternatively, an UV source having a wavelength ranging from about 150 nanometers (nm) to about 400 nm. In one particular embodiment, the as-deposited film is exposed to UV in a different chamber than the deposition chamber after a desired film thickness is reached.

In an embodiment wherein the film is treated with a plasma, a passivation layer such as $SiO_2$ or carbon doped $SiO_2$ is deposited to prevent chlorine and nitrogen contamination to penetrate into film in the subsequent plasma treatment. The passivation layer can be deposited using atomic layer deposition or cyclic chemical vapor deposition.

In an embodiment wherein the film is treated with a plasma, the plasma source is selected from the group consisting of hydrogen plasma, plasma comprising hydrogen and helium, plasma comprising hydrogen and argon. Hydrogen plasma lowers the film dielectric constant and boosts the damage resistance following a plasma ashing process while still keeping the carbon content in the bulk almost unchanged.

Without intending to be bound by a particular theory, it is believed that the silicon precursor compound having a chemical structure represented by Formulae A to C as defined above can be anchored via reacting the organoamino group with hydroxyl on the substrate surface to provide multiple Si—O—Si fragments per molecule of precursor, thus boosting the growth rate of silicon oxide or carbon doped silicon oxide compared to conventional silicon precursors such as bis(tert-butylamino)silane or bis(diethylamino)silane having only one silicon atom.

In certain embodiments, the silicon-containing films described herein have a dielectric constant of 6 or less, 5 or less, 4 or less, and 3 or less. In these or other embodiments, the films can have a dielectric constant of about 5 or below, or about 4 or below, or about 3.5 or below. However, it is envisioned that films having other dielectric constants (e.g., higher or lower) can be formed depending upon the desired end-use of the film. An example of the silicon-containing film that is formed using the silicon precursors having Formula A to C and processes described herein has the formulation $SiO_yC_zN_vH_w$ wherein Si ranges from about 10% to about 40%; O ranges from about 0% to about 65%; C ranges from about 0% to about 75% or from about 0% to about 50%; N ranges from about 0% to about 75% or from about 0% to 50%; and H ranges from about 0% to about 50% atomic percent weight % wherein x+y+z+v+w=100 atomic weight percent, as determined for example, by XPS or other means. Another example of the silicon containing film that is formed using the silicon precursors of Formula A to C and processes described herein is silicon carbo-oxynitride wherein the carbon content is from 1 at % to 80 at % measured by XPS. In yet, another example of the silicon containing film that is formed using the silicon precursors having Formula A to C and processes described herein is amorphous silicon wherein both sum of nitrogen and carbon contents is <10 at %, preferably <5 at %, most preferably <1 at % measured by XPS.

As mentioned previously, the method described herein may be used to deposit a silicon-containing film on at least a portion of a substrate. Examples of suitable substrates include but are not limited to, silicon, $SiO_2$, $Si_3N_4$, OSG, FSG, silicon carbide, hydrogenated silicon oxycarbide, hydrogenated silicon oxynitride, silicon carbo-oxynitride, hydrogenated silicon carbo-oxynitride, antireflective coatings, photoresists, germanium, germanium-containing, boron-containing, Ga/As, a flexible substrate, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The deposited films have applications, which include, but are not limited to, computer chips, optical devices, magnetic information storages, coatings on a supporting material or substrate, microelectromechanical systems (MEMS), nanoelectromechanical systems, thin film transistor (TFT), light emitting diodes (LED), organic light emitting diodes (OLED), IGZO, and liquid crystal displays (LCD). Potential use of resulting solid silicon oxide or carbon doped silicon oxide include, but not limited to, shallow trench insulation, inter layer dielectric, passivation layer, an etch stop layer, part of a dual spacer, and sacrificial layer for patterning.

In certain embodiments, one or more silicon precursors having Formulae A to C described herein can be used to form silicon and oxygen containing films that are solid and are non-porous or are substantially free of pores.

The following Examples are provided to illustrate certain aspects of the invention and shall not limit the scope of the appended claims.

WORKING EXAMPLES

Thermal Atomic Layer Deposition of silicon oxide films were performed on a laboratory scale ALD processing tool. The silicon precursor was delivered to the chamber by vapor draw. All gases (e.g., purge and reactant gas or precursor and oxygen source) were preheated to 100° C. prior to entering the deposition zone. Gases and precursor flow rates were controlled with ALD diaphragm valves with high speed actuation. The substrates used in the deposition were 12-inch-long silicon strips. A thermocouple is attached on the sample holder to confirm substrate temperature. Depositions were performed using ozone as oxygen source gas. Normal deposition process and parameters are shown in Table 2.

TABLE 2

Process for Thermal Atomic Layer Deposition of Silicon Oxide Films with Ozone as Oxygen Source on the Laboratory Scale ALD Processing Tool.

| Step 1 | 6 sec | Evacuate reactor | <100 mT |
|---|---|---|---|
| Step 2 | variable duration | Dose Silicon precursor | Reactor pressure typically <2 Torr |
| Step 3 | 6 sec | Purge reactor with nitrogen | Flow 1.5 slpm $N_2$ |
| Step 4 | 6 sec | Evacuate reactor | <100 mT |
| Step 5 | variable duration | Dose oxygen source ozone | |
| Step 6 | 6 sec | Purge reactor with nitrogen | Flow 1.5 slpm $N_2$ |

After deposition, precursor treatment on the sample were done in the same laboratory scale ALD processing tool. The silicon precursor was delivered to the chamber by vapor draw. Precursor vapors were preheated to 100° C. prior to entering the deposition zone. Gases and precursor flow rates were controlled with ALD diaphragm valves with high speed actuation.

Wet etch rate (WER) measurements were performed by using 1:99 diluted hydrofluoric (HF) acid solution. Thermal oxide wafers were used as standard for each set of experiments to confirm the etch solution's activity. The samples were all etched for 15 seconds to remove any surface layer before starting to collect the bulk film's WER. A typical thermal oxide wafer wet etch rate for 1:99 dHF water solution was 0.5 Å/s by this procedure. All density measurements were measured by x-ray reflectivity (XRR) method. Compositional analysis was done using secondary ion mass spectrometry (D-SIMS) or X-ray photoelectron spectroscopy (XPS). Dielectric constant (k) measurements were performed using a Materials Development Corporation (MDC) mercury probe model 802B calibrated with thermal oxides standards.

Example 1: Chemical Treatment on Thermal Atomic Layer Deposition of Silicon-containing Films Deposited from 2-dimethylamino-2,4,6,8-tetramethylcyclotetrasiloxane having Formula B wherein $R^1=R^2=R^3=R^4=R^6=R^8$=methyl, $R^5=R^7=R^9$=hydrogen.

Atomic layer deposition of silicon- and oxygen-containing films was conducted using the following precursor: 2-dimethylamino-2,4,6,8-tetramethylcyclotetrasiloxane. The depositions were performed on the laboratory scale ALD processing tool. The silicon precursor was delivered to the chamber by vapor draw. Deposition process and parameters are provided in Table 2. Steps 1 to 6 are repeated until a desired thickness is reached. The deposition process temperature, ozone concentration, and GPC are provided in Table 3a and film properties are provided in 3b. At low temperature (100° C.), with different ozone concentration, carbon doped silicon oxide films were obtained.

TABLE 3a

Thermal ALD Deposition Temperature, ozone concentration, and GPC of 2-dimethylamino-2,4,6,8-tetramethylcyclotetrasiloxane with Ozone process.

| Deposition Temperature | Ozone concentration | GPC (Å/cycle) |
|---|---|---|
| 100° C. | 6% | 1.9 |
| 100° C. | 14% | 2.7 |
| 100° C. | 20% | 4.7 |
| 300° C. | 20% | 3.3 |

TABLE 3b

Thermal ALD Deposition Temperature, Ozone concentration, and Film Properties of 2-dimethylamino-2,4,6,8-tetramethylcyclotetrasiloxane with Ozone process.

| Sample | Deposition Temperature | Ozone concentration | C content (atom %) | N content (atom %) | Relative WER to Thermal Oxide | Density (g/cm3) |
|---|---|---|---|---|---|---|
| Sample A | 100° C. | 6% | 17 | ND | 0.06 | 1.44 |
| Sample B | 100° C. | 14% | 16 | ND | 0.15 | 1.50 |
| Sample C | 100° C. | 20% | 14 | ND | 0.15 | 1.51 |
| Sample D | 300° C. | 20% | ND | ND | 12.7 | 2.16 |

The films deposited at 100° C. (samples A-C) were either treated with silicon precursor N,N-dimethyltrimethylsilylamine (DMATMS) at 300° C. for 5 mins with precursor chamber pressure at 0.3 Torr or treated with silicon precursor N,N-diethylaminotrimethylsilylamine (DEATMS) at 450° C. for 5 mins at 0.3 Torr. The film k values before and after treatment and the WER after treatment are shown in Table 4.

TABLE 4

SiOC Film k value and WER before and after chemical treatment with DMATMS at 300° C. or DEATMS at 450° C.

| Sample | C content (%) | k as deposited | k after DMATMS 300° C. treatment | k after DEATMS 450° C. treatment | WER after chemical treatment |
|---|---|---|---|---|---|
| Sample A | 17 | 5.2 | 2.4 | 2.6 | Hydrophobic, no detectable etch after 7 mins dip |
| Sample B | 16 | 5.9 | 3.6 | 2.8 | Hydrophobic, no detectable etch after 7 mins dip |

TABLE 4-continued

SiOC Film k value and WER before and after chemical treatment
with DMATMS at 300° C. or DEATMS at 450° C.

| Sample | C content (%) | k as deposited | k after DMATMS 300° C. treatment | k after DEATMS 450° C. treatment | WER after chemical treatment |
|---|---|---|---|---|---|
| Sample C | 14 | 5.5 | 3.6 | 2.7 | Hydrophobic, no detectable etch after 7 mins dip |

Example 2: Chemical Treatment on Thermal Atomic Layer Deposition of Carbon Doped Silicon Oxide Films Using Diethylaminomethylsilane having Formula C wherein $R^1$ and $R^2$ are ethyl, $R^{10}$=methyl Atomic layer deposition of silicon oxide films was conducted using the following precursor: diethylaminomethylsilane. The depositions were performed on the laboratory scale ALD processing tool. The silicon precursor was delivered to the chamber by vapor draw. Deposition process and parameters are provided in Table 2. Steps 1 to 6 were repeated until a desired thickness were reached. The substrate temperature was 100° C. The deposition temperature, ozone concentration, GPC, and film properties are provided in Table 5

TABLE 5

Thermal ALD Deposition Temperature,
GPC of diethylaminomethylsilane
with Ozone process.

| Deposition Temperature | Ozone concentration | GPC (Å/cycle) | C content (atom. %) |
|---|---|---|---|
| 100° C. | 6% | 1.3 | 13.5 |

The films deposited at 100° C. were treated with silicon precursor N,N-diethylaminotrimethylsilylamine (DEATMS) at 300° C. for 5 mins and 25 min, or treated with silicon precursor di-iso-propylaminosilane (DIPAS) at 300° C. for 5 mins and 10 mins, or annealed at 300° C. without chemical treatment. The film k values before and after the different treatments are shown in Table 6.

TABLE 6

Carbon doped silicon oxide film k values before
and after chemical treatment with DEATMS at
300° C. or DIPAS at 300° C.

| k as deposited | k after 300° C. anneal for 60 mins | k after DEATMS 300° C. treatment 5 mins | k after DEATMS 300° C. treatment 25 mins | k after DIPAS 300° C. treatment 5 mins | k after DIPAS 300° C. treatment 10 mins |
|---|---|---|---|---|---|
| 6.0 | 5.2 | 2.9 | 2.7 | 3.2 | 3.2 |

Although the disclosure has been described with reference to certain preferred embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments, but that the invention will include all embodiments falling within the scope of the appended claims.

The invention claimed is:

1. A method for depositing a carbon doped silicon oxide film onto a substrate, the method comprising the steps of:
   a) providing a substrate in a reactor;
   b) introducing into the reactor at least one first silicon precursor selected from the group consisting of Formulae A to C

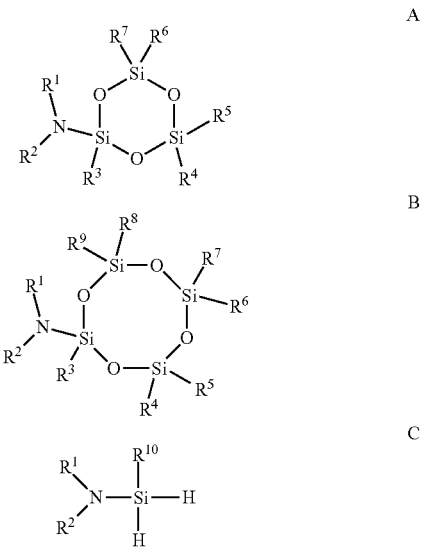

wherein $R^1$ is selected from a linear $C_1$ to $C_{10}$ alkyl group, a branched $C_3$ to $C_{10}$ alkyl group, a $C_3$ to $C_{10}$ cyclic alkyl group, a $C_3$ to $C_{10}$ heterocyclic group, a $C_3$ to $C_{10}$ alkenyl group, a $C_3$ to $C_{10}$ alkynyl group, and a $C_4$ to $C_{10}$ aryl group; $R^2$ is selected from the group consisting of hydrogen, a $C_1$ to $C_{10}$ linear alkyl group, a branched $C_3$ to $C_{10}$ alkyl group, a $C_3$ to $C_{10}$ cyclic alkyl group, a $C_3$ to $C_{10}$ heterocyclic group, a $C_2$ to $C_{10}$ alkenyl group, a $C_2$ to $C_{10}$ alkynyl group, and a $C_4$ to $C_{10}$ aryl group, wherein $R^1$ and $R^2$ in Formula A or B are either linked to form a cyclic ring structure or are not linked to form a cyclic ring structure; $R^{3-9}$ are each independently selected from hydrogen, a linear $C_1$ to $C_{10}$ alkyl group, a branched $C_3$ to $C_{10}$ alkyl group, a $C_3$ to $C_{10}$ cyclic alkyl group, a $C_2$ to $C_{10}$ alkenyl group, a $C_2$ to $C_{10}$ alkynyl group, and a $C_4$ to $C_{10}$ aryl group; $R^{10}$ is selected from a linear $C_1$ to $C_{10}$ alkyl group, a $C_2$ to $C_{10}$ alkenyl group, and a $C_2$ to $C_{10}$ alkynyl group;
   c) purging the reactor using purge gas to remove at least a portion of any of the at least one first silicon precursor unabsorbed on the substrate;
   d) introducing an oxygen-containing source into the reactor to react with the at least one first silicon precursor and form a silicon oxide film;
   e) purging the reactor using purge gas to remove at least a portion of any unreacted oxygen-containing source;
   f) repeating steps b through e until a desired thickness of the silicon oxide film is deposited;
   g) treating the silicon oxide film with a second silicon precursor having a formula of $R^3{}_x Si(NR^1R^2)_{4-x}$ wherein $R^{1-3}$ are defined as above, and x=1, 2, or 3 to form the carbon doped silicon oxide film, wherein the second silicon precursor is not reacted with an oxygen-containing source by introducing an oxygen-containing source into the reactor; and h) purging the reactor using purge gas to remove at least a portion of any by-products from treating the silicon oxide film with the second silicon precursor;

wherein the method is conducted at one or more temperatures ranging from about 20° C., to 300° C.

2. The method of claim 1 wherein each of $R^{1-2}$ is a $C_1$ to $C_4$ alkyl group.

3. The method of claim 1 wherein $R^{1-3}$ are each independently selected from the group consisting of methyl and ethyl.

4. The method of claim 1, wherein the at least one first silicon precursor compound is selected from the group consisting of 2-dimethylamino-2,4,4,6,6-pentamethylcyclotrisiloxane, 2-diethylamino-2,4,4,6,6-pentamethylcyclotrisiloxane, 2-ethylmethylamino-2,4,4,6,6-pentamethylcyclotrisiloxane, 2-iso-propylamino-2,4,4,6,6-pentamethylcyclotrisiloxane, 2-dimethylamino-2,4,4,6,6,8,8-heptamethylcyclotetrasiloxane, 2-diethylamino-2,4,4,6,6,8,8-heptamethylcyclotetrasiloxane, 2-ethylmethylamino-2,4,4,6,6,8,8-heptamethylcyclotetrasiloxane, 2-iso-propylamino-2,4,4,6,6,8,8-heptamethylcyclotetrasiloxane, 2-dimethylamino-2,4,6-trimethylcyclotrisiloxane, 2-diethylamino-2,4,6-trimethylcyclotrisiloxane, 2-ethylmethyl-amino-2,4,6-trimethylcyclotrisiloxane, 2-iso-propylamino-2,4,6-trimethylcyclotrisiloxane, 2-dimethylamino-2,4,6,8-tetramethylcyclotetrasiloxane, 2-diethylamino-2,4,6,8-tetramethylcyclotetrasiloxane, 2-ethylmethylamino-2,4,6,8-tetramethylcyclotetrasiloxane, and 2-iso-propylamino-2,4,6,8-tetramethylcyclotetrasiloxane, 2-pyrrolidino-2,4,4,6,6-pentamethylcyclotrisiloxane, 2-pyrrolyl-2,4,4,6,6-pentamethylcyclotrisiloxane, 2-piperidino-2,4,4,6,6-pentamethylcyclotrisiloxane, 2-2,5-dimethylpiperidino-2,4,4,6,6-pentamethylcyclotrisiloxane, 2-cyclohexylmethylamino-2,4,4,6,6-pentamethylcyclotrisiloxane, 2-phenylmethylamino-2,4,4,6,6-pentamethylcyclotrisiloxane, 2-cyclohexylamino-2,4,4,6,6-pentamethylcyclotrisiloxane, 2-cyclopentylamino-2,4,4,6,6-pentamethylcyclotrisiloxane, 2-pyrrolidino-2,4,4,6,6,8,8-heptamethylcyclotetrasiloxane, 2-pyrrolyl-2,4,4,6,6,8,8-heptamethylcyclotetrasiloxane, 2-cyclohexylmethylamino-2,4,4,6,6,8,8-heptamethylcyclotetrasiloxane, 2-phenylmethylamino-2,4,4,6,6,8,8-heptamethylcyclotetrasiloxane, 2-cyclohexylamino-2,4,4,6,6,8,8-heptamethylcyclotetrasiloxane 2-cyclopentylamino-2,4,4,6,6,8,8-heptamethylcyclotetrasiloxane, 2-pyrrolidino-2,4,6-trimethylcyclotrisiloxane, 2-pyrrolyl-2,4,6-trimethylcyclotrisiloxane, 2-cyclohexylmethylamino-2,4,6-trimethylcyclotrisiloxane, 2-phenylmethylamino-2,4,6-trimethylcyclotrisiloxane, 2-cyclohexylamino-2,4,6-trimethylcyclotrisiloxane, 2-cyclopentylamino-2,4,6-trimethylcyclotrisiloxane, 2-pyrrolidino-2,4,6,8-tetramethylcyclotetrasiloxane, 2-pyrrolyl-2,4,6,8-tetramethylcyclotetrasiloxane, 2-piperidino-2,4,4,6,6,8,8-heptamethylcyclotetrasiloxane, 2-2,5-dimethylpiperidino-2,4,4,6,6,8,8-heptamethylcyclotetrasiloxane, 2-cyclohexylmethylamino-2,4,6,8-tetramethylcyclotetrasiloxane, 2-phenylmethylamino-2,4,6,8-tetramethylcyclotetrasiloxane, 2-cyclohexylamino-2,4,6,8-tetramethylcyclotetrasiloxane, and 2-cyclopentylamino-2,4,6,8-tetramethylcyclotetrasiloxane, dimethylaminomethylsilane, diethylaminomethylsilane, di-iso-propylaminomethylsilane, di-sec-butylaminomethylsilane, cyclohexylmethylaminomethylsilane, and 2,6-dimethylpiperidinomethylsilane.

5. The method of claim 1, wherein the at least one second silicon precursor compound is selected from the group consisting of diethylaminotriethylsilane, dimethylaminotriethylsilane, ethylmethylaminotriethylsilane, t-butylaminotriethylsilane, isopropylaminotriethylsilane, di-isopropylaminotriethylsilane, pyrrolidonotriethylsilane, diethylaminotrimethylsilane, dimethylaminotrimethylsilane, ethylmethylaminotrimethylsilane, t-butylaminotrimethylsilane, iso-propylaminotrimethylsilane, di-isopropylaminotrimethylsilane, pyrrolidonotrimethylsilane, diethylaminodimethylsilane, dimethylaminodimethylsilane, ethylmethylaminodimethylsilane, t-butylaminodimethylsilane, iso-propylaminodimethylsilane, di-isopropylaminodimethylsilane, pyrrolidinodimethylsilane, diethylaminodiethylsilane, dimethylaminodiethylsilane, ethylmethylaminodiethylsilane, t-butylaminodiethylsilane, isopropylaminodiethylsilane, di-isopropylaminodiethylsilane, pyrrolidinodiethylsilane, bis(diethylamino)dimethylsilane, bis(dimethylamino)dimethylsilane, bis(ethylmethylamino)dimethylsilane, bis(di-isopropyllamino)dimethylsilane, bis(iso-propylamino)dimethylsilane, bis(tert-butylamino)dimethylsilane, dipyrrolidinodimethylsilane, bis(diethylamino)diethylsilane, bis(dimethylamino)diethylsilane, bis(ethylmethylamino)diethylsilane, bis(di-isopropyllamino)diethylsilane, bis(iso-propylamino)diethylsilane, bis(tert-butylamino) diethylsilane, dipyrrolidinodiethylsilane, bis(diethylamino)methylvinylsilane, bis(dimethylamino)methylvinylsilane bis(ethylmethylamino)methylvinylsilane, bis(di-isopropyl-lamino)methylvinylsilane, bis(iso-propylamino)methylvinylsilane, bis(tert-butylamino)methylvinylsilane, dipyrrolidino methylvinylsilane, 2,6-dimethylpiperidinomethylsilane, 2,6-dimethylpiperidinodimethylsilane, 2,6-dimethylpiperidinotrimethylsilane, tris(dimethylamino) phenylsilane, tris(dimethylamino)methylsilane, and tris(dimethylamino)ethylsilane.

6. A method for depositing a carbon doped silicon oxide film onto a substrate, the method comprising the steps of:

a) providing a substrate in a reactor;

b) introducing into the reactor at least one first organoamino-polysiloxane precursor selected from the group consisting of 2-dimethylamino-2,4,4,6,6-pentamethylcyclotrisiloxane, 2-diethylamino-2,4,4,6,6-pentamethylcyclotrisiloxane, 2-ethylmethylamino-2,4,4,6,6-pentamethylcyclotrisiloxane, 2-iso-propylamino-2,4,4,6,6-pentamethylcyclotrisiloxane, 2-dimethylamino-2,4,4,6,6,8,8-heptamethylcyclotetrasiloxane, 2-diethylamino-2,4,4,6,6,8,8-heptamethylcyclotetrasiloxane, 2-ethylmethylamino-2,4,4,6,6,8,8-heptamethylcyclotetrasiloxane, 2-iso-propylamino-2,4,4,6,6,8,8-heptamethylcyclotetrasiloxane, 2-dimethylamino-2,4,6-trimethylcyclotrisiloxane, 2-diethylamino-2,4,6-trimethylcyclotrisiloxane, 2-ethylmethylamino-2,4,6-trimethylcyclotrisiloxane, 2-iso-propylamino-2,4,6-trimethylcyclotrisiloxane, 2-dimethylamino-2,4,6,8-tetramethylcyclotetrasiloxane, 2-diethylamino-2,4,6,8-tetramethylcyclotetrasiloxane, 2-ethylmethylamino-2,4,6,8-tetramethylcyclotetrasiloxane, and 2-iso-propylamino-2,4,6,8-tetramethylcyclotetrasiloxane, 2-pyrrolidino-2,4,4,6,6-pentamethylcyclotrisiloxane, 2-pyrrolyl-2,4,4,6,6-pentamethylcyclotrisiloxane, 2-piperidino-2,4,4,6,6-pentamethylcyclotrisiloxane, 2-2,5-dimethylpiperidino-2,4,4,6,6-pentamethylcyclotrisiloxane, 2-cyclohexylmethylamino-2,4,4,6,6-pentamethylcyclotrisiloxane, 2-phenylmethylamino-2,4,4,6,6-pentamethylcyclotrisiloxane, 2-cyclohexylamino-2,4,4,6,6-pentamethylcyclotrisiloxane, 2-cyclopentylamino-2,4,4,6,6-pentamethylcyclotrisiloxane, 2-pyrrolidino-2,4,4,6,6,8,8-heptamethylcyclotetrasiloxane, 2-pyrrolyl-2,4,4,6,6,8,8-heptamethylcyclotetrasiloxane, 2-cyclohexylmethylamino-2,4,4,6,6,8,8-heptamethylcyclotetrasiloxane, 2-phenylmethylamino-2,4,4,6,6,8,8-heptamethylcyclotetrasiloxane, 2-cyclohexylamino-2,4,4,6,6,8,8-heptamethylcyclotetrasiloxane
2-cyclopentylamino-2,4,4,6,6,8,8-heptamethylcyclotetrasiloxane, 2-pyrrolidino-2,4,6-trimethylcyclotrisiloxane, 2-pyrrolyl-2,4,6-trimethylcyclotrisiloxane, 2-cyclohexylmethylamino-2,4,6-trimethylcyclotrisiloxane, 2-phenylmethylamino-2,4,6-trimethylcyclotrisiloxane, 2-cyclohexylamino-2,4,6-trimethylcyclotrisiloxane, 2-cyclopentylamino-2,4,6-trimethylcyclotrisiloxane, 2-pyrrolidino-2,4,6,8-tetramethylcyclotetrasiloxane, 2-pyrrolyl-2,4,6,8-tetramethylcyclotetrasiloxane, 2-piperidino-2,4,4,6,6,8,8-heptamethylcyclotetrasiloxane, 2-2,5-dimethylpiperidino-2,4,4,6,6,8,8-heptamethylcyclotetrasiloxane, 2-cyclohexylmethylamino-2,4,6,8-tetramethylcyclotetrasiloxane, 2-phenylmethylamino-2,4,6,8-tetramethylcyclotetrasiloxane, 2-cyclohexylamino-2,4,6,8-tetramethylcyclotetrasiloxane, and 2-cyclopentylamino-2,4,6,8-tetramethylcyclotetrasiloxane, dimethylaminomethylsilane, diethylaminomethylsilane, di-iso-propylaminomethylsilane, di-sec-butylaminomethylsilane, cyclohexylmethylaminomethylsilane, and 2,6-dimethylpiperidinomethylsilane;

c) purging the reactor with purge gas to remove at least a portion of any of the at least one first silicon precursor unabsorbed on the substrate;

d) introducing an oxygen-containing plasma source into the reactor to react with the at least one first silicon precursor and form a primary silicon-containing film;

e) purging the reactor using purge gas to remove at least a portion of any unreacted oxygen-containing plasma source;

f) repeating steps b through e until a desired thickness of the primary silicon-containing film is deposited;

g) introducing into the reactor at least one second silicon precursor having a formula of $R^3_x Si(NR^1R^2)_{4-x}$ wherein $R^{1-3}$ are defined as above, and x=1, 2, or 3;

h) purging the reactor using purge gas to remove at least a portion of any of the at least one second silicon precursor that is unabsorbed on the primary silicon-containing film;

i) introducing an oxygen-containing source into the reactor to form a secondary silicon-containing film;

j) purging the reactor using purge gas to remove at least a portion of any unreacted oxygen-containing source; and k) repeating steps g through j until a desired thickness of the secondary silicon-containing film is deposited;

wherein the method is conducted at one or more temperatures ranging from about 20° C., to 300° C.

7. The method of claim 6 wherein each of $R^{1-2}$ is a $C_1$ to $C_4$ alkyl group.

8. The method of claim 6 wherein wherein $R^{1-3}$ are each independently selected from the group consisting of methyl and ethyl.

9. The method of claim 6, wherein the at least one second silicon precursor compound is selected from the group consisting of di-iso-propylaminosilane, di-sec-butylaminosilane, bis(diethylamino)silane, and bis(tert-butylamino)silane.

* * * * *